US007276953B1

(12) United States Patent
Peng et al.

(10) Patent No.: US 7,276,953 B1
(45) Date of Patent: Oct. 2, 2007

(54) LEVEL SHIFTING INPUT BUFFER CIRCUIT

(75) Inventors: Tao Peng, Nashua, NH (US); Wen Zhou, Los Altos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/964,040

(22) Filed: Oct. 13, 2004

Related U.S. Application Data

(60) Provisional application No. 60/519,412, filed on Nov. 12, 2003.

(51) Int. Cl.
*H03L 5/00* (2006.01)
(52) U.S. Cl. ......................................... 327/333; 326/63
(58) Field of Classification Search ................. 327/333; 326/81, 80, 63, 68
See application file for complete search history.

(56) References Cited

U.S. PATENT DOCUMENTS

| | | | |
|---|---|---|---|
| 4,150,308 A | | 4/1979 | Adlhoch |
| 4,475,050 A | | 10/1984 | Noufer |
| 4,978,870 A | | 12/1990 | Chen et al. |
| 5,113,097 A | | 5/1992 | Lee |
| 5,742,183 A | * | 4/1998 | Kuroda ......................... 326/81 |
| 5,942,921 A | * | 8/1999 | Talaga, Jr. .................... 327/77 |
| 6,147,540 A | * | 11/2000 | Coddington ................. 327/333 |
| 6,184,738 B1 | * | 2/2001 | Iwamoto et al. ............. 327/333 |
| 6,271,707 B1 | | 8/2001 | Le et al. |
| 6,275,070 B1 | * | 8/2001 | Pantelakis et al. ............. 326/98 |
| 6,414,534 B1 | * | 7/2002 | Wang et al. ................. 327/333 |
| 6,518,790 B2 | * | 2/2003 | Wada et al. ................... 326/81 |
| 6,535,019 B2 | | 3/2003 | De Santis |
| 6,586,984 B1 | * | 7/2003 | Radke .......................... 327/309 |
| 6,774,673 B2 | | 8/2004 | Tsuboi et al. |
| 6,784,700 B1 | | 8/2004 | Hunt et al. |
| 6,784,717 B1 | | 8/2004 | Hunt et al. |
| 6,785,107 B1 | | 8/2004 | Schmitt |
| 6,788,125 B1 | * | 9/2004 | Tomsio ........................ 327/333 |
| 6,801,064 B1 | | 10/2004 | Hunt et al. |
| 6,888,381 B2 | * | 5/2005 | Momtaz et al. ................ 327/58 |
| 6,940,318 B1 | * | 9/2005 | Wong ........................... 327/77 |

* cited by examiner

*Primary Examiner*—Quan Tra
*Assistant Examiner*—Ryan Jager
(74) *Attorney, Agent, or Firm*—Haverstock & Owens LLP

(57) ABSTRACT

An input circuit (200) operating at a predetermined power supply voltage ($V_{PW}$) can level shift a high voltage input signal ($V_{INHV}$) from a higher voltage value to the lower power supply voltage ($V_{PW}$) level. An input circuit (200) can include input transistors (206-0 and 206-1) having a source-follower configuration. A first input transistor (206-0) receives a high voltage input signal ($V_{INHV}$) and a second input transistor (206-1) receives a reference voltage ($V_{REF}$), which can both reach levels greater than power supply voltage ($V_{PW}$). A compare circuit (204) can reduce duty cycle distortion to generate a lower voltage input signal ($V_{INLV}$). Input circuit (200) can provide level shifting from LVTTL levels to low voltage CMOS levels without the need for multiple power supply voltages.

11 Claims, 4 Drawing Sheets

LEVEL SHIFTING INPUT BUFFER CIRCUIT

This application claims the benefit of U.S. provisional patent application Ser. No. 60/519,412, filed Nov. 12, 2003.

TECHNICAL FIELD

The present invention relates generally to input circuits, and more particularly to input circuits for level shifting input signals from a higher voltage level to internal input signals having a lower voltage level.

BACKGROUND OF THE INVENTION

While integrated circuit power supply levels continue to fall to smaller levels, it remains desirable to accommodate input signals for integrated circuits that have voltage levels higher than a low power supply level. As but one particular example, low voltage transistor-transistor logic (LVTTL) signals can swing from between about 0 to 3.3 volts. However, integrated circuits may be capable of operating internally at much lower voltage levels (e.g., 1.2 volts). Thus, in order to provide compatibility with LVTTL systems, an integrated circuit can include a voltage translator, or level shift circuit that can translate a higher voltage signal (e.g., LVTTL 0-3.3 volts) to a lower voltage signal (e.g., 0-1.2 volts).

A conventional input circuit for accommodating level shifting is set forth in FIG. 6 and designated by the general reference character 600. An input circuit 600 can include two stages: a high voltage stage 602 and a low voltage stage 604. A high voltage stage 604 can provide a differential comparison between a high voltage input signal $V_{INHV}$ and a reference voltage to thereby provide a high voltage input signal $V_{IN'}$. For example, the logic of an input signal $V_{INHV}$ that varies between about 0 and 3.3 volts can be compared to a reference voltage of about 1.5 volts. A resulting output signal $V_{IN'}$ from high voltage stage 602 can be a high voltage signal (e.g., swing between about 0 and 3.3 volts) having a level dependent upon the differential comparison between the high voltage input signal $V_{INHV}$ and the reference voltage.

In order to accommodate lower voltage internal circuits of a semiconductor device (e.g., complementary metal-oxide-semiconductor (CMOS) voltage levels), a high voltage signal $V_{IN'}$ can be translated to lower voltage levels by a low voltage stage 604. A low voltage stage 604 can level shift signal $V_{IN'}$ from a high voltage (e.g., 0 to 3.3 volts) to a low voltage (e.g., 0 to 1.2 volts). Thus, a resulting output signal $V_{INLV}$ from low voltage stage 604 can be a low voltage signal.

As illustrated in FIG. 6, a conventional input circuit 600 can receive two different power supplies. In particular, a high voltage stage 602 can receive a high voltage supply (e.g., 3.3/2.5 volts) while a low voltage stage 604 can receive a low voltage supply (1.2 volts). Thus, high voltage stage 602 may include high voltage devices, such as transistors and the like, capable of receiving high voltage levels, while a low voltage stage 604 may include low voltage devices, which may not be optimized for the higher voltage levels.

More particularly, a high voltage stage 602 can include high voltage insulated gate field effect transistors (IGFETs) having a thicker gate insulator and/or different source/drain doping. Still further, higher voltage devices are typically placed in different diffusion regions (e.g., wells) than lower voltage devices and/or can have larger spacing requirements than lower voltage devices.

A more detailed example of a conventional input circuit, like that set forth in FIG. 6, is shown in a schematic diagram in FIG. 7. The input circuit of FIG. 7 is designated by the general reference character 700, and can include a high voltage stage 702 and a low voltage stage 704. A high voltage stage 702 can include a bias current circuit 706, a differential pair 708, and an active load circuit 710. A current bias circuit 706 can be connected to a high voltage power supply, VDD, and supply a bias current to differential pair 708. Differential pair 708 can draw a differential current based on a comparison between input signals $V_{INHV}$ and $V_{REF}$. An active load circuit 710 can provide a high voltage output signal $V_{IN'}$ based on the differential current of the differential pair 708.

It is noted that all of the transistors of the bias current circuit 706 and differential pair 708 are high voltage transistors, indicated by the label MAX. Thus, such transistors can occupy more space than low voltage transistors. Further, high voltage p-channel transistors in CMOS circuits can be particularly undesirable, as such transistors are typically twice as large as corresponding high voltage n-channel transistors. Further, the high voltage stage 702 is connected to a high power supply voltage VDD.

It is further noted that some, or all of the n-channel transistors within a high voltage stage 702 may also be high voltage transistors.

Thus, in the conventional arrangement, signal amplification is performed in a high voltage domain with a high supply voltage VDD and high voltage transistors.

A conventional low voltage stage 704 can include voltage limiting section 712 and an inverter 714. Voltage limiting section 712 can generate an output signal based on high voltage signal $V_{IN'}$. The majority of the transistors of the low voltage stage 704 can be low voltage transistors that operate at a power supply voltage VPW that is lower than VDD.

A conventional input circuit 700 can introduce a signal delay of about 700 picoseconds (ps). This delay can result from delay introduced by the differential compare operation of high voltage stage 702, as well as the level shifting operation provided by low voltage stage 704.

While the conventional input circuits described above can translate a high voltage signal to a low voltage signal, it is always desirable to arrive at some way of improving the performance of such circuits.

For example, it is almost always desirable to arrive at an input circuit having a faster operating speed and/or lower power consumption than a conventional approach. It is noted that high swing nodes of the conventional input circuit 700 (e.g., drains of differential compare transistors in differential pair 708), as well as "crowbar" current in the level shifting section 712, can result in undesirably high power consumption.

In addition, because circuit size can relate proportionally to cost, it is desirable to arrive at some way of reducing circuit size.

Still further, it is desirable to reduce the complexity of circuit design. For example, as shown in FIG. 8, because the above described conventional circuit has two power supply voltages (VDD and VPW), an integrated circuit employing such a circuit must include a low power supply routing 814 and a high power supply routing 812. In addition, as noted above, a dual power supply device typically has separate regions for high and low voltage devices. For example, high voltage devices may reside in one region 810, while low voltage devices may reside in a different region 808. As but one very detailed example, region 810 can include high voltage p-channel devices formed in n-wells biased to a high voltage VDD, while region 808 can include p-channel devices formed in n-wells biased to the lower voltage VPW. In an even more particular example, a low voltage region 808 of conventional integrated circuit 800 may include logic circuits 804 and core circuits 806. Core circuits 806 can include memory cells and the like.

Along these same lines, a dual voltage device (e.g., one operating at VDD and VPW) may suffer from concerns related to power sequencing (i.e., the order, rate, etc., at which such different power supplies are applied to the device). That is, a multiple power supply device may have additional latch-up susceptibility and/or complexity in establishing logic states. Further, power sequencing typically demands a particular order, which simply adds to the complexity of start-up operations for an electronic device that contains the integrated circuit.

In addition, in the conventional example of FIG. 7, current sources (I1, I2 and I3) are provided to establish biasing currents for a differential pair and active current mirror load. The current source bias values can be I1=5 micro amps (µA), I2=5 µA, and I3=15 µA. Typically, such circuits are based on "band-gap" reference voltage circuits (band-gap circuits), and thus present a load on the band-gap circuits. It would be desirable to arrive at some way of reducing band-gap circuit load, as such reductions can reduce overall circuit size and complexity. For example, conventional band-gap circuits typically include a bipolar transistor structure, or the like, having an area proportional to current load. By reducing band gap current load, size and power of the device can reduced.

SUMMARY OF THE INVENTION

The present invention can include an integrated circuit powered by a power supply voltage having a first magnitude. The integrated circuit can include one or more high voltage input nodes that receive input signals having a potential swing of a second magnitude that is greater than the first magnitude. A first high voltage input transistor can have a gate terminal coupled to a high voltage input node and a source-drain path coupled between the power supply voltage and a first internal node. The first high voltage input transistor can be designed to withstand a higher gate voltage than a majority of the transistors of the integrated circuit device, which can be low voltage transistors.

In the above arrangement, a high voltage input signal can be translated to a lower voltage level by a circuit that only receives a lower magnitude power supply voltage.

According to one aspect of the embodiments, an integrated circuit can include a plurality of input buffer circuits, each corresponding to a predetermined high voltage signal. Further, the number of high voltage input transistors in each input buffer circuit can be no greater than 2.

Such a small number of high voltage devices for each input buffer can result in a more compact circuit.

According to another aspect of the embodiments, a first high voltage input transistor can have a feature selected from the group consisting of: a thicker gate dielectric than the low voltage transistors, a different gate dielectric material than the low voltage transistors, and a different source/drain doping than the low voltage transistors.

According to another aspect of the embodiments, an integrated circuit can further include a compare circuit powered by the power supply voltage having a first compare input node coupled to the first internal node and a second input node coupled to a reference node.

According to another aspect of the embodiments, an integrated circuit may further include a second high voltage input transistor having a gate terminal coupled to a reference voltage and a source-drain path coupled between the power supply voltage and a reference node. Such a second high voltage input transistor can match a first high voltage input transistor.

In such an arrangement first and second high voltage input transistors can provide a differential voltage at their sources that is level shifted to the first, lower magnitude.

According to another aspect of the embodiments, a compare circuit can include a differential amplifier circuit having a differential transistor pair. The differential transistor pair can include a first compare transistor having a gate coupled to the first internal node and a second compare transistor having a gate coupled to the reference node.

Such a differential amplifier circuit can reduce any duty cycle distortion that may be introduced by first and second high voltage input transistors.

According to another aspect of the embodiments, the first high voltage input transistor can be a first conductivity type and the differential transistor pair can be a second conductivity type.

According to another aspect of the embodiments, the differential amplifier circuit may further include a current supply transistor of the second conductivity type that provides a bias current path to the differential transistor pair, and a current mirror load circuit coupled to the sources of the differential pair. The current mirror load circuit can be formed from transistors of the first conductivity type.

According to another aspect of the embodiments, a power supply voltage can be about X volts, a reference voltage can be about Y volts. In addition, the threshold voltage of the first high voltage input transistor can be greater than Y-X.

In such an arrangement, a first input transistor can guarantee that the first input transistor is in a high gain mode (e.g., saturation) in the region around the reference voltage level.

According to another aspect of the embodiments, an integrated circuit may also include at least a first current source circuit coupled to the source of a first high voltage input transistor. At least a second current source circuit can be coupled to the source of a second high voltage input transistor.

According to another aspect of the embodiments, a first magnitude can be no greater than about 1.4 volts and the second magnitude can be less than about 2.0 volts.

The present invention may also include an input buffer circuit having a first input transistor configured as a source-follower having a drain at a first power supply potential, a gate that receives a high voltage input signal having a maximum value greater than the first power supply potential, and a source that provides an output signal. The input buffer may further include a second input transistor configured as a source-follower having a drain at the first power supply potential, a gate that receives a reference voltage greater than the first power supply potential, and a source that provides a reference signal.

According to one aspect of the embodiments, a first power supply voltage can be no greater than 1.3 volts, and a reference voltage can be no less than 1.0 volt.

According to another aspect of the embodiments, an input buffer circuit can further include a differential amplifier circuit having a first input coupled to the output signal and a second input coupled to the reference signal.

According to another aspect of the embodiments, an input buffer circuit can further include a first current source circuit coupled between the source of the first input transistor and a low supply potential. In addition, a second current source circuit can be coupled between the source of the first input transistor and a low supply potential. The first and second current source circuits can each draw no more than 4 microamperes.

The present invention may also include a method of level shifting an externally received input signal to a lower internal voltage level. The method can include the steps of receiving an external input signal at a gate of a first insulated gate field effect transistor (IGFET) configured as a source follower, with a drain at a first power supply potential that is lower than a maximum potential of the external received input signal. The method can further include placing the first IGFET into saturation as the external input signal exceeds a predetermined reference voltage that is less than the maximum potential of the externally received input signal.

According to one aspect of the embodiments, the method may further include applying the reference voltage to a gate of a second IGFET configured as a source follower, the second IGFET matching the first IGFET.

According to another aspect of the embodiments, the method may further include amplifying a differential voltage generated between the sources of the first and second IGFETs to generate an internal signal having a smaller voltage swing than the received input signal.

According to another aspect of the embodiments, receiving an external input signal can include receiving an input signal having a voltage swing greater than about 2.2 volts. In addition, a lower internal level can be less than 1.5 volts.

DETAILED DESCRIPTION

Various embodiments of the present invention will now be described in detail with reference to a number of drawings. The embodiments include an input circuit that can translate high voltage signals into lower voltage signals. Such an input circuit can be a low voltage circuit, and not require a high voltage power supply.

Figure 1:
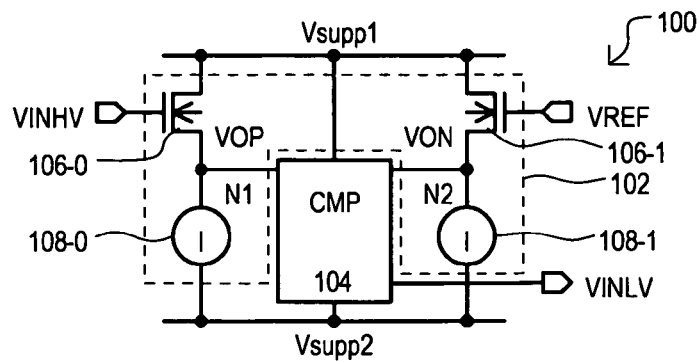
FIG. 1 is a block schematic diagram of one embodiment of the present invention.

Referring now to FIG. 1, an input circuit according to one embodiment is shown in a block schematic diagram and designated by the general reference character 100. An input circuit 100 can include a level shifting input section 102 and a compare section 104.

A level shifting input section 102 can include a first input transistor 106-0, second input transistor 106-1, first current source circuit 108-0 and a second current source circuit 108-1. A first input transistor 106-0 can have a source follower configuration, including a drain connected to a first power supply voltage Vsupp1, a gate that receives a high voltage input signal $V_{INHV}$, and a source that provides an output signal $V_{OP}$ at node N1 that corresponds to the high voltage input signal $V_{INHV}$. A first current source circuit 108-0 can be connected between node N1 and a second power supply voltage Vsupp2.

A second input transistor 106-1 can also have a source follower configuration, including a drain connected to a power supply voltage Vsupp1, a gate that receives a reference voltage $V_{REF}$, and a source that provides an output signal $V_{ON}$ at node N2. A second current source circuit 108-1 can be connected between node N2 and a power supply voltage Vsupp2.

A compare section 104 can compare potentials between nodes N1 and N2 to generate a low voltage input signal $V_{INLV}$ that corresponds to the high voltage input signal $V_{INHV}$, but includes a smaller voltage swing.

Unlike the conventional level shifting circuits described above, all sections of input circuit 100 can be powered by a supply voltage (Vsupp1-Vsupp2) that is less than a maximum voltage of high voltage input signal $V_{INHV}$. As but one example, assuming Vsupp2 is ground, a power supply voltage Vsupp1 may be no greater than 2.0 volts, preferably no greater than 1.7 volts, even more preferably no greater than 1.3 volts. Similarly, a maximum voltage for high voltage input signal $V_{INHV}$ can be no less than 2.0 volts, preferably no less than 2.2 volts, even more preferably no less than 2.5 volts. As but one particular example, a high voltage input signal $V_{INHV}$ can be a low voltage transistor-transistor logic (LVTTL) signal that can vary between 0 and 3.3 volts, while a power supply voltage Vsupp1 can be a 1.2 volt CMOS level voltage.

However, the present invention could be applicable to lower and/or higher voltage levels with appropriate adjustment to transistor threshold voltages and/or compare section 104 design, as would be understood from the following description.

Referring still to FIG. 1, within level shifting input section 102, first and second input transistors (106-0 and 106-1) could be high voltage devices. At the same time, the majority of transistors of an integrated circuit containing the input circuit 100 can be low voltage transistors designed to withstand the power supply voltage Vsupp1, but not necessarily a considerably higher voltage, such as a maximum voltage of high voltage input signal $V_{INHV}$.

High voltage transistors can be distinguishable from low voltage transistors by numerous features, including but not limited to: a thicker and/or different gate oxide, a different drain and/or source diffusion, greater and/or thicker isolation from adjacent active areas, and/or formation in a different active areas than low voltage devices (i.e., diffusion region, well).

The above arrangement can result in an input circuit that receives a power supply voltage Vsupp1, but can still provide level shifting capabilities. Consequently, the embodiments of the present invention can dispense with the various drawbacks associated with multiple power supplies mentioned above (e.g., power sequencing, separate high voltage power supply routing, etc.).

Figure 7:
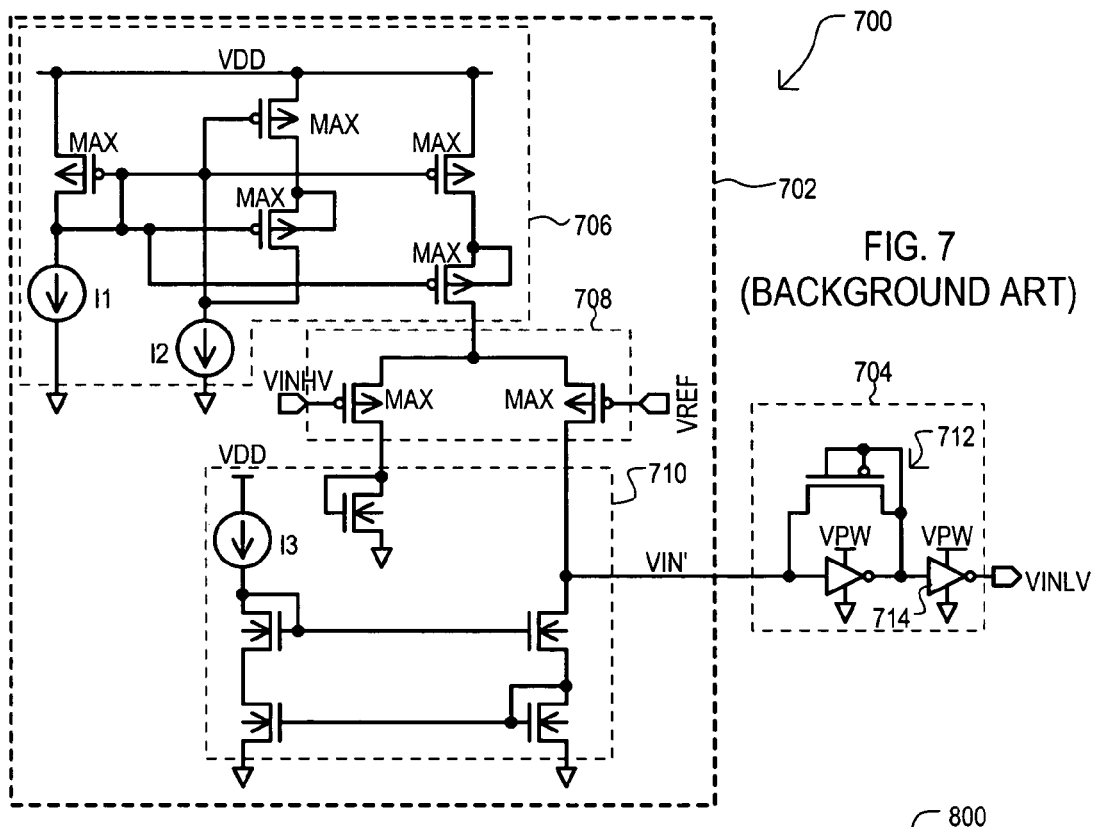
FIG. 7 is a schematic diagram of a conventional input circuit like that set forth in FIG. 6.

Still further, a resulting circuit size can be reduced over the conventional case, as only two high voltage transistors can be included per input, as opposed to the numerous high voltage transistors utilized in the conventional case of FIG. 7.

Even further, as noted previously, the conventional arrangement may form high voltage p-channel transistors in a different well or substrate than low voltage p-channel transistors. In contrast, in the arrangement of FIG. 1, high voltage n-channel transistors can be formed in the same substrate area as low voltage n-channel transistors. This can further reduce the overall size of the input circuit 100 as compared to the conventional approach.

Figure 2:
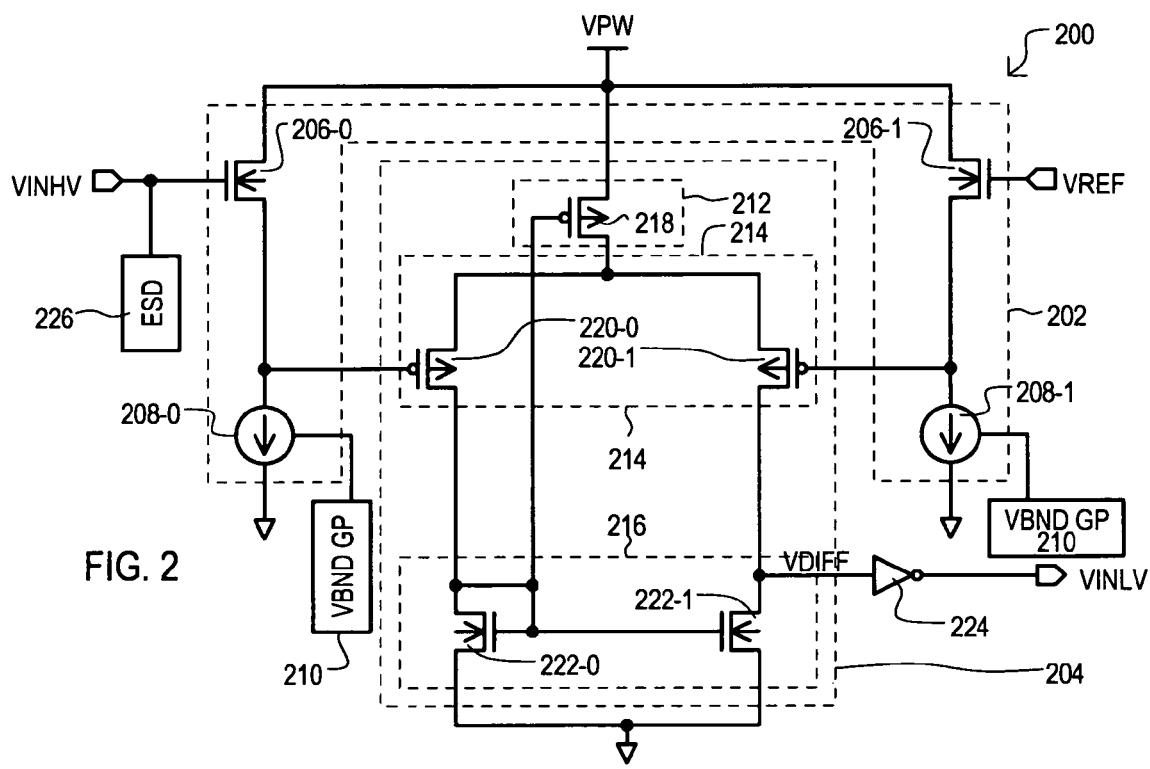
FIG. 2 is a schematic diagram of another embodiment of the present invention.

Referring now to FIG. 2, a more detailed example of an input circuit according to an embodiment is set forth in a schematic diagram and designated by the general reference character 200. The input circuit 200 can include a level shifting input section 202 and a compare section 204. A level shifting input section 202 can include a first input transistor 206-0, a second input transistor 206-1, a first current source circuit 208-0, and a second current source circuit 208-1.

First and second input transistors (206-0 and 206-1) can be high voltage n-channel transistors. First input transistor 206-0 can receive an input signal $V_{INHV}$ that may vary as described in FIG. 1. Second input transistor 206-1 can "match" first input transistor 206-1, having the same essential size and/or threshold doping and/or construction.

First current source circuit 208-0 can provide a direct current (DC) of no more than 7 micro amps (µA), preferably no more than 5 µA, even more preferably no more than about 3 µA. In a preferred arrangement, a DC current level of first current source can be established according to a band-gap reference voltage circuit 210. A second current source circuit 208-1 can have the same essential structure as the first current source circuit 208-0, supply the same essential DC current, and be controlled according to a band-gap reference circuit 210.

It is understood that while a band-gap reference circuit 210 is shown as two boxes in FIG. 2, the same band-gap reference circuit can control both first and second current source circuits (208-0 and 208-1).

Figure 6:
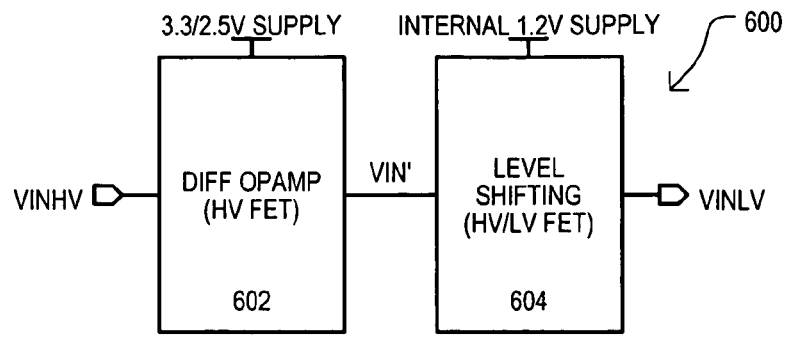
FIG. 6 is a block schematic diagram of a conventional input circuit.
Figure 8:
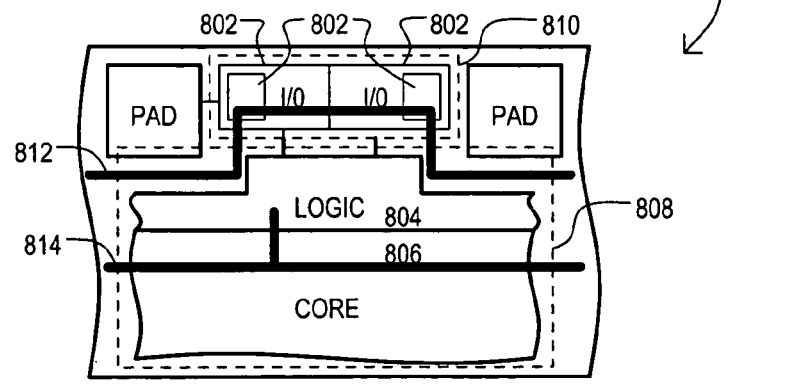
FIG. 8 is a top plan view of a conventional integrated circuit.

As in the case of FIG. 1, level shifting input section 202 can be connected to a low voltage power supply $V_{PW}$, and thus an integrated circuit incorporating such an input circuit can dispense with multiple power supplies, unlike the conventional approaches of FIGS. 6-8.

A level shifting input section 202 can operate in the same essential manner as level shifting input section 102 of FIG. 1. In particular, a high voltage input signal $V_{INHV}$ can have a maximum voltage greater than a power supply $V_{PW}$ voltage. Further, first input transistor 106-0 can go into saturation as high voltage input signal $V_{INHV}$ surpasses the voltage of power supply $V_{PW}$. A reference voltage signal $V_{REF}$ can be a reference voltage for distinguishing a logic value of $V_{INHV}$.

In one very particular approach, a high voltage input signal $V_{INHV}$ can vary from about 0 to 3.3 volts, a power supply voltage $V_{PW}$ can be about 1.2 volts, and a reference voltage can be about 1.5 volts. Input transistors (106-0 and 106-1) can be n-channel transistors having threshold voltages set to about 0.6 volts. In such an arrangement, as high voltage input signal $V_{INHV}$ reaches the reference voltage level $V_{REF}$, first input transistor 106-0 may already be in saturation. Further, first input transistor 106-0 can remain in saturation as high voltage input signal $V_{INHV}$ continues to rise up to about 3.3 volts.

While the various voltage of FIG. 2 may be generated in a number of ways, in one very particular arrangement, a semiconductor device including an input circuit 200 may receive an external power supply voltage of about 1.8 volts. The semiconductor device can include band-gap circuits to generate an a low voltage power supply $V_{PW}$ of about 1.2 volts and a reference voltage $V_{REF}$ of about 1.5 volts from the external supply voltage.

Thus, level shifting input section 102 can be conceptualized as clamping an output voltage (e.g., voltage at source of first input transistor 106-0) at a power supply voltage $V_{PW}$ when first input transistor 106-0 is in saturation. Conversely, when first input transistor 106-0 is off, the output voltage can be at a low supply level (e.g., 0 volts).

This response can allow for rapid determination of the logic of high voltage input signal $V_{INHV}$ without having to rely on a high voltage differential pair arrangement as in the conventional case of FIG. 7.

In the case where first and second input transistors (206-0 and 206-1) are high voltage devices, such devices can be n-channel transistors, and thus be even smaller than high voltage p-channel transistors, as is the case in the conventional approach of FIG. 7.

While a level shifting input section 202 can provide both level detect and level shifting abilities, a resulting output signal (e.g., the signal at the source of second input transistor 206-1) may suffer from some duty cycle distortion. In the example of FIG. 2, such distortion can be addressed with compare section 204.

In the particular example of FIG. 2, a compare section 204 can include a current source section 212, a differential compare section 214, and a load section 216. A current source section 212 can include a p-channel transistor 218 that is biased to provide a bias current to differential compare section 212.

Differential compare section 214 can include two p-channel transistors arranged as a differential pair, with a first differential transistor 220-0 receiving a source-follower output from first input transistor 206-0 and a second differential transistor 220-1 receiving a source-follower output from second input transistor 206-1.

Load section 216 can be an active load that includes n-channel transistors 222-0 and 222-1 arranged in a current mirror configuration. In the particular example of FIG. 2, p-channel transistor 218 can be biased by having a gate connection to the common gate-drain connection of reference transistor 222-0 of load section 216 to provide a desired biasing.

As shown in FIG. 2, compare section 204 can receive the power supply voltage $V_{PW}$, and provide a low voltage signal $V_{DIFF}$ that follows high voltage input signal $V_{INHV}$. Low voltage signal $V_{DIFF}$ can vary between a low supply voltage (e.g., ground) and power supply voltage $V_{PW}$. In this way, the input circuit 200 can provide a level shifting of high voltage input signal $V_{INHV}$.

A low voltage signal $V_{DIFF}$ can be buffered by buffer 224 to generate a low voltage input signal $V_{INLV}$. In the particular example of FIG. 2, a buffer 224 can be a CMOS type inverter.

Referring still to FIG. 2, a high voltage input signal $V_{INHV}$ can be received at an input pad, or the like, of an integrated circuit. Thus, in such an arrangement, first input transistor 206-0 can directly receive high voltage input signal $V_{INHV}$. Accordingly, it is preferable to provide an electrostatic discharge (ESD) protection circuit 226 at such an input to provide ESD protection to first input transistor 206-0.

A compare section 204 can improve the duty cycle of an output signal provided by level shifting input section 202. That is, a source-follow arrangement like that of level shifting input section may introduce almost negligible delay. However, the clamping operation can introduce some distortion in the duty cycle of a resulting output signal (e.g., the source of second input transistor 206-1). A differential pair circuit, like that of compare section 204 can reduce duty cycle distortion (DCD). In the particular arrangement of FIG. 2, a resulting DCD can be about 1.4%.

Thus, in contrast to the conventional arrangement of FIG. 7, with input circuit 200, amplification can be performed in the low voltage domain by compare section 204, at a low power supply voltage $V_{PW}$.

As compared to the conventional circuit of FIG. 7, the embodiment of FIG. 2 can provide reductions in power consumption. In particular, an input circuit 200 can include only two current sources (208-0 and 208-1) that can draw as little as 3 µA each, as opposed to the three current sources (I1, I2 and I3) that draw much greater amounts of current. In addition, by performing differential compare operations in a lower voltage domain, additional power savings can result.

Such power saving will now be described in more detail. As noted above, in the conventional arrangement, assuming 3.3 volt LVTTL levels, a voltage at differential nodes can swing between 0 and 3.3 volts. In contrast, within differential compare section 214, a voltage at differential nodes can be limited to a lower internal voltage (e.g., 1.2 volts). Assuming the same general loads, power can be 7.5 times lower (i.e., $P=V^2/load$, $V=3.3$ volts vs. $V=1.2$ volts). Finally, the crowbar current associated with the level shift section of the conventional case can be eliminated.

Along these same lines, the embodiment of FIG. 2 can present a much smaller load on band gap reference circuits than the conventional case. In particular, assuming current sources 208-0 and 208-1 draw 3 µA, an input circuit 200 can draw 6 µA. This is in sharp contrast to the conventional case which can draw 40 µA. Such a smaller current draw can provide considerable reduction in the loading on band-gap circuits, particularly in integrated circuits having a large number of inputs.

In one very particular approach, transistors 206-0 and 206-1 can be high voltage transistors having width-to-length (W/L) ratios of (0.42/0.35) (in microns), transistors 218, 222-0 and 222-1 can be low voltage transistors with W/Ls of (0.5/0.1), and transistors 222-0 and 222-1 can be low voltage transistor with W/Ls of (0.25/0.1).

Figure 3:
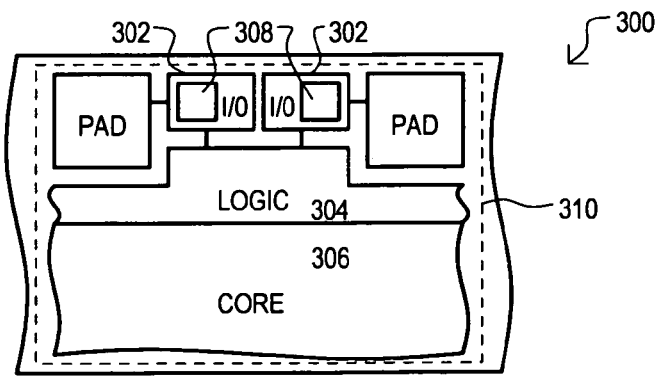
FIG. 3 is top plan view of an integrated circuit according to one embodiment.

Referring now to FIG. 3, a portion of an integrated circuit according to one embodiment is designated by the general reference character 300. An integrated circuit 300 can include input/output (I/O) circuits 302, logic circuits 304 and core circuits 306. I/O circuits 302 can include input circuits 308 for receiving input signals. Input circuits 308 may take the form of those circuits represented by FIGS. 1 and/or 2, or equivalents. In one particular arrangement, core circuits 306 can include memory cells, or the like.

As understood by comparing FIG. 3 with FIG. 8, semiconductor device 300 can be more compact than conventional semiconductor device 800, as input circuits 308 can be formed within a low voltage region 310. That is, a semiconductor device 300 can include no, or only limited high voltage regions. This is in sharp contrast to the conventional approach 800 that provides separate high voltage regions 802 and supply routing 812 for high voltage input circuit elements.

That is, unlike conventional approaches, an integrated circuit 300 can accommodate high voltage input signals with input buffers that are situated in the same low voltage blocks as a logic and/or core circuits.

Figure 4:
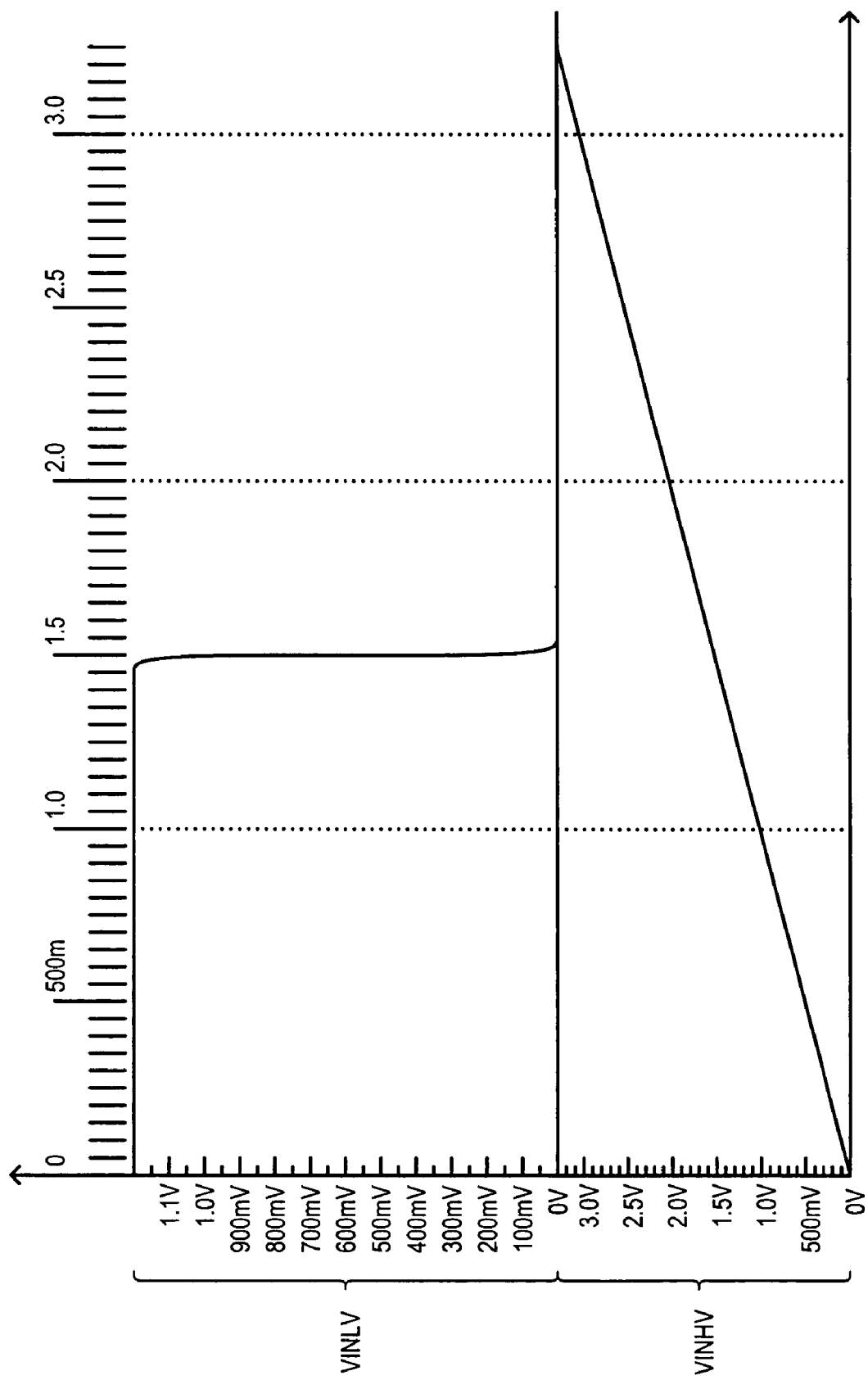
FIG. 4 is a graph showing a DC response of a circuit according to the embodiment set forth in FIG. 2.

Referring now to FIG. 4, a graph shows a DC sweep simulation of the input circuit 200 of FIG. 2. As shown by the graph, as a high voltage input signal $V_{INHV}$ transitions from a low voltage of about 0 volts to a high voltage of about 3.3 volts, low voltage input signal $V_{INLV}$ can transition from about 1.2 volts to about 0 volts. More particularly, low voltage input signal $V_{INLV}$ can make a relatively sharp transition from 1.2 volts to 0 volts when the high voltage input signal $V_{INHV}$ reaches the reference voltage level $V_{REF}$ of about 1.5 volts.

Figure 5:
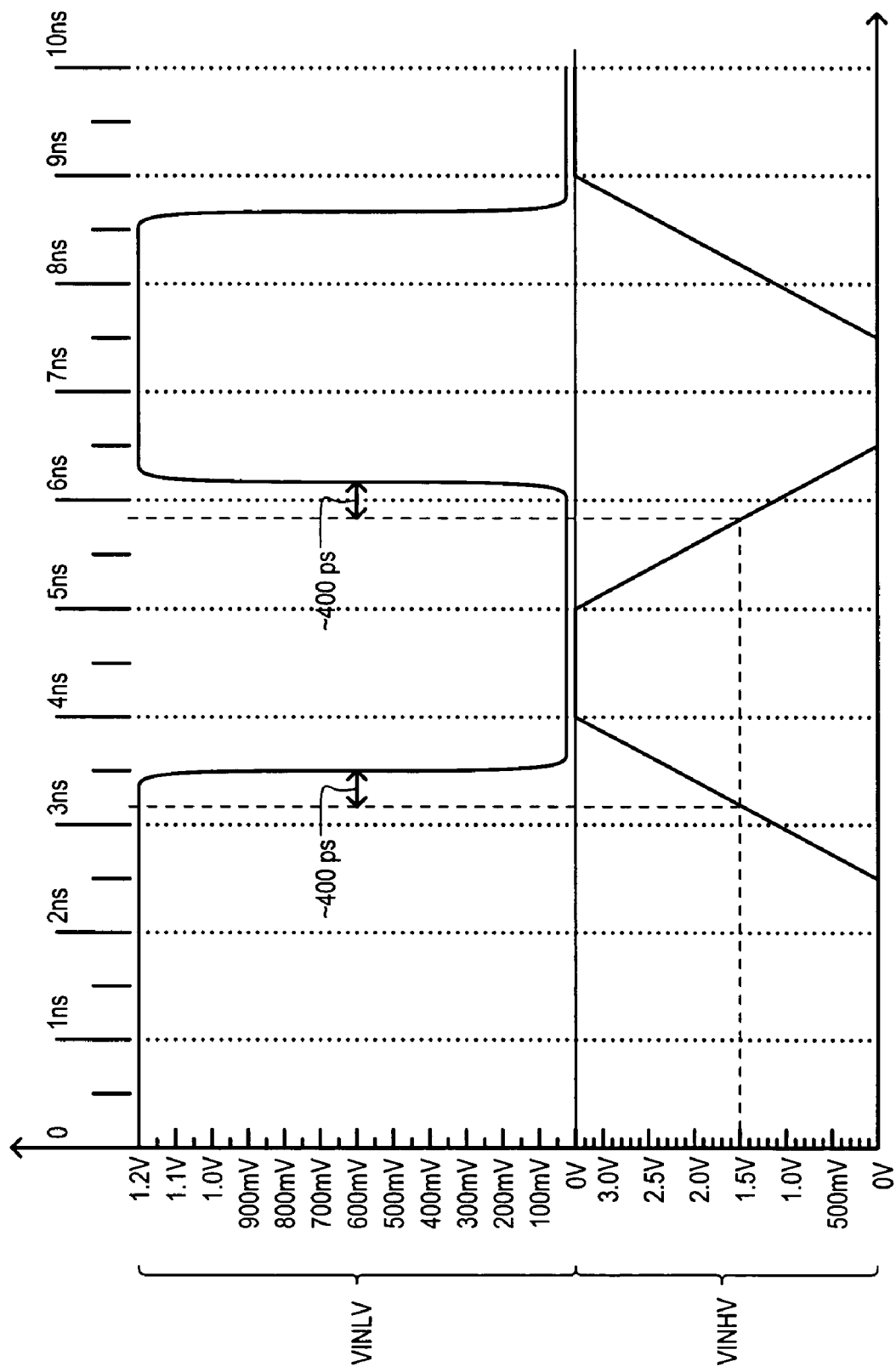
FIG. 5 is a graph showing a transient response of a circuit according to the embodiment set forth in FIG. 2.

Referring now to FIG. 5, a graph shows a transient simulation response of the input circuit 200 of FIG. 2. As shown by the graph, the input circuit 200 can introduce a signal delay of about 400 picoseconds (ps). Such a response is a considerable improvement over the 700 ps delay of the conventional input circuit 700 of FIG. 7.

An input circuit according to the various embodiments can be applied to various integrated circuits, but may be particularly applicable to devices where high speed access is desirable, such as static random access memories (SRAMs), more particularly dual-port SRAMs, or the like. Still further, the present invention may be particularly advantageous as an input circuit for an integrated circuit that can accommodating higher input signal levels of "legacy" systems or standards.

While the various aspects of the particular embodiments set forth herein have been described in detail, the present invention could be subject to various changes, substitutions, and alterations without departing from the spirit and scope of the invention.

What is claimed is:

1. An integrated circuit powered by a power supply voltage having a first magnitude, comprising:
   at least one high voltage input node that receives an input signal having a potential swing of a second magnitude that is greater than the first magnitude; and
   a plurality of transistors, the majority of which are low voltage transistors, the plurality of transistors including at least one first high voltage input transistor having a gate terminal coupled to the at least one first high voltage input node and a source-drain path coupled between the power supply voltage and a first internal node, the at least one first high voltage input transistor designed to withstand a higher gate voltage than the low voltage transistors;
   at least one first current source circuit coupled to the source of the at least one first high voltage input transistor that provides a current controlled according to a first current reference voltage;
   the plurality of transistors further including at least one second high voltage input transistor having a gate terminal coupled to a reference voltage and a source-drain path coupled between the power supply voltage and a reference node; and
   at least a second current source circuit coupled to the source of the at least one second high voltage input transistor that provides a current controlled according to a second current reference voltage.

2. The integrated circuit of claim 1, wherein:
   the integrated circuit includes a plurality of input buffer circuits, each corresponding to a predetermined high voltage signal; and
   the at least one first high voltage input transistor comprises no more than 2 high voltage input transistors in each input buffer circuit.

3. The integrated circuit of claim 1, wherein:
   each of the at least one first high voltage input transistor has a feature selected from the group consisting of: a thicker gate dielectric than the low voltage transistors, a different gate dielectric material than the low voltage transistors, and a different source/drain doping than the low voltage transistors.

4. The integrated circuit of claim 1, further including:

a compare circuit powered by the power supply voltage that includes a first compare input node coupled to the first internal node and a second input node coupled to a reference node.

5. The integrated circuit of claim 4, wherein:

at least one second high voltage input transistor having a gate terminal coupled to a reference voltage and a source-drain path coupled between the power supply voltage and the reference node.

6. The integrated circuit of claim 5, wherein:

the at least one second high voltage input transistor is a matching transistor to the at least one first high voltage input transistor.

7. The integrated circuit of claim 4, wherein:

the compare circuit comprises a differential amplifier circuit having a differential transistor pair with a first compare transistor having a gate coupled to the first input node and a second compare transistor having gate coupled to the reference node.

8. The integrated circuit of claim 7, wherein:

the at least one first high voltage input transistor is of a first conductivity type and the differential transistor pair are of a second conductivity type.

9. The integrated circuit of claim 8, wherein:

the compare circuit further comprises a current supply transistor of the second conductivity type that provides a bias current path to the differential transistor pair, and a current mirror load circuit coupled to the sources of the differential pair formed from transistors of the first conductivity type.

10. The integrated circuit of claim 1, wherein:

the power supply voltage has a voltage of about X volts;

the reference voltage has an essentially constant value of about Y volts and is greater than the power supply voltage; and the at least one first high voltage input transistor has a threshold voltage greater than Y-X.

11. The integrated circuit of claim 1, wherein:

the first magnitude is no greater than about 1.4 volts and the second magnitude is less than about 2.0 volts.

* * * * *